(12) United States Patent
Xing

(10) Patent No.: US 9,887,114 B2
(45) Date of Patent: Feb. 6, 2018

(54) IC CARTRIDGE

(71) Applicant: BOE TECHNOLOGY GROUP CO., LTD., Beijing (CN)

(72) Inventor: Yang Xing, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/907,748

(22) PCT Filed: Aug. 27, 2015

(86) PCT No.: PCT/CN2015/088202
§ 371 (c)(1),
(2) Date: Jan. 26, 2016

(87) PCT Pub. No.: WO2016/127623
PCT Pub. Date: Aug. 18, 2016

(65) Prior Publication Data
US 2016/0372354 A1    Dec. 22, 2016

(30) Foreign Application Priority Data

Feb. 12, 2015    (CN) .......................... 2015 1 0076874

(51) Int. Cl.
*B65D 85/00*    (2006.01)
*H01L 21/673*    (2006.01)
*A45C 11/24*    (2006.01)

(52) U.S. Cl.
CPC ........ *H01L 21/67333* (2013.01); *A45C 11/24* (2013.01)

(58) Field of Classification Search
CPC .......... H01L 21/67333; H01L 21/6734; H01L 21/67356; A45C 11/24
(Continued)

(56) References Cited

U.S. PATENT DOCUMENTS 6,889,841 B2 *   5/2005   Maccoux ........... H05K 13/0084
                                                      206/722
7,244,326 B2    7/2007   Craig et al.
(Continued)

FOREIGN PATENT DOCUMENTS

CN         1792128 A       6/2006
CN       102512820 A       6/2012
(Continued)

OTHER PUBLICATIONS

Chinese Office Action in Chinese Application No. 201510076874.X dated Nov. 4, 2015 with English translation.
(Continued)

*Primary Examiner* — J. Gregory Pickett
*Assistant Examiner* — Rafael Ortiz
(74) *Attorney, Agent, or Firm* — Collard & Roe, P.C.

(57) ABSTRACT

An IC cartridge is provided, which includes: a cartridge body provided with hollowed-out parts, and an ejection mechanism including a substrate and projected structures which are provided on the substrate and can be slideably extended into the hollowed-out parts for pushing out IC chips; the hollowed-out parts and the projected structures cooperate to form groove structures for accommodating the IC chips. In usage, the IC chip in the groove structure are pushed out by sliding of the projected structures of the ejection mechanism through the hollowed-out parts. Thus, removing and flipping over of the IC chips is facilitated, and the processing safety of the IC chip can be ensured.

8 Claims, 5 Drawing Sheets

(58) Field of Classification Search
USPC ........ 206/722, 701, 706–708, 711, 714, 725,
206/557, 559, 564, 363
See application file for complete search history.

(56) References Cited

U.S. PATENT DOCUMENTS

| | | | |
|---|---|---|---|
| 7,258,703 B2 * | 8/2007 | Cheng | .................... G01R 1/045 |
| | | | 206/557 |
| 2005/0006029 A1 | 1/2005 | Suzuki et al. | |
| 2014/0262928 A1 * | 9/2014 | Han | .................. H01L 21/67333 |
| | | | 206/711 |

FOREIGN PATENT DOCUMENTS

| | | |
|---|---|---|
| CN | 202433938 U | 9/2012 |
| CN | 203086868 U | 7/2013 |
| CN | 203382121 U | 1/2014 |
| CN | 103692479 A | 4/2014 |
| CN | 203665786 U | 6/2014 |
| CN | 203781359 U | 8/2014 |
| CN | 104605599 A | 5/2015 |
| JP | 2004-358579 A | 12/2004 |

OTHER PUBLICATIONS

International Search Report of PCT/CN2015/088202 in Chinese, dated Dec. 3, 2015 with English translation.
Notice of Transmittal of the International Search Report of PCT/CN2015/088202 in Chinese, dated Dec. 3, 2015.
Written Opinion of the International Searching Authority of the International Search Report of PCT/CN2015/088202 in Chinese, dated Dec. 3, 2015 with English translation.

* cited by examiner

IC CARTRIDGE

CROSS REFERENCE TO RELATED APPLICATIONS

This application is the National Stage of PCT/CN2015/088202 filed on Aug. 27, 2015, which claims priority under 35 U.S.C. § 119 of Chinese Application No. 201510076874.X filed on Feb. 12, 2015, the disclosure of which is incorporated by reference.

TECHNICAL FIELD

The embodiment of the present invention relates to IC cartridge used for manufacturing of display devices, in particular to an IC cartridge for easily removing and flipping over of IC chips.

BACKGROUND

The IC cartridge in the prior art is a cartridge body structure for holding an IC chip. IC flip over must be performed before IC bonding every time; and dust-free cloth, alcohol (acetone and other solvents are unsuitable), a substituting IC cartridge (empty IC cartridge) and a pair of bamboo forceps must be prepared for IC flip over. It should be noted that during the process of IC flip over, no one is allowed to move around while a designated staff is flipping over the IC, and any others should not touch the IC. In addition, during the process of IC flip over, the IC fallen on the floor should be picked up by the pair of bamboo forceps, and then determined by microscopic examination such that if the result is OK, the IC is continuously processed; and if the result is NG, a clean cotton swab socked with alcohol is used to wipe the IC which is then subjected to microscopic examination again. The entire IC BUMP must be checked completely and should not be checked only by a part. Accordingly, if the result is OK, the IC is continuously processed; and if there is any mark on the IC that cannot be wiped or the IC is bumped or scratched, the IC should be discarded. During the process of IC flip over, IC discarding occurs from time to time, and the production cost is increased accordingly.

SUMMARY

According to embodiments of the present invention, an IC cartridge is provided, which is used for ensuring the safety and improving the manufacturing efficiency of IC chips during the processing procedure of the IC chips.

According to some embodiment of the present invention, an IC cartridge is provided, which comprises: a cartridge body provided with hollowed-out parts; and an ejection mechanism, which includes a substrate and projected structures which are provided on the substrate and may be extended into the hollowed-out parts; wherein the hollowed-out parts and the projected structures cooperatively form groove structures for containing IC chips; and the projected structures is slideable through the hollowed-out parts of the cartridge body and is configured to push the IC chip out from the hollowed-out part. In the usage of the IC cartridge, the IC chips are placed into the groove structures so as to be accommodated in the IC cartridge. When the IC chips needs to be removed from the IC cartridge, the projected structures of the ejection structure slide through the hollowed-out parts and push out the IC chip, so that the IC chips are easily removed. When the IC chips needs to be flipped over, the IC cartridge accommodating the IC chips may be arranged to face against another empty IC cartridge. Subsequently, the IC chip are pushed out from the cartridge body holding the IC chips by the ejection mechanism; at this point, the IC chip is transferred from a cartridge body of one IC cartridge into a cartridge body of another IC cartridge. After transfer of the IC chips is completed, the two IC cartridges are separated. Then, the flipover of the IC chip are completed. As can be seen from the above description, the IC chip are conveniently removed by usage of the IC cartridge; the flipover of the IC chip is also convenient achieved; the processing efficiency of the IC chip is improved; and meanwhile, the processing safety of the IC chip is also ensured.

For instance, according to some embodiments of the present invention, the IC cartridge may further comprises a buffer spring both ends of which press against the cartridge body and the substrate respectively. The buffer spring provides a restoring force of the ejection mechanism.

For instance, according to some embodiments of the present invention, the cartridge body may be provided with a plurality of mounting holes for mounting the buffer spring. Thus, the stability of the restoring force provided by the buffer spring can be improved.

For instance, according to some embodiments of the present invention, the ejection mechanism may further includes a supporting base which is fixedly connected with the cartridge body; and a gap for accommodating the substrate is formed between the supporting base and the cartridge body. The substrate can be secured by the cooperating of the supporting base and the cartridge body.

For instance, according to some embodiments of the present invention, the ejection mechanism further comprises a pushing piece which is provided on a side wall of the supporting base, and is slideably engaged with the supporting base, and reciprocates between a first position and a second position; an arcuate convex structure is provided on the substrate for cooperating with the pushing piece; while the pushing piece is placed at the first position, the pushing piece presses against the bottom of the arcuate convex structure and pushes up the arcuate convex structure and hence pushes up the substrate, such that the projected structures on the substrate raise and push the IC chips contained in the groove structures out from the hollowed-out parts; and while the pushing piece is disposed at the second position, the pushing piece is disengaged from the bottom of the arcuate convex structure which is then not under any thrust force, such that the substrate and the projected structures on the substrate are restored to their initial positions. Thus, the projected structures are actuated by the pushing piece.

For instance, according to some embodiments of the present invention, the supporting base may be provided with a sliding passage, wherein the longitudinal direction of the sliding passage is parallel to an end surface of the cartridge body, and the pushing piece is slideably accepted in the sliding passage. The pushing piece is slideably connected with the supporting base through the sliding passage.

For instance, according to some embodiments of the present invention, the ejection mechanism further comprises a pushing piece which is pivotally connected with the supporting base so as to pivots between a first position and a second position; the substrate is provided with an arcuate convex structure for cooperating with the pushing piece; while the pushing piece is pivoted to the first position, the pushing piece presses against the bottom of the arcuate convex structure and pushes up the arcuate convex structure and hence pushes up the substrate, so that the projected structures on the substrate raise and push the IC chip contained in the groove structures out from the hollowed-out part; and while the pushing piece is pivoted to the second position, the pushing piece is disengaged from the bottom of the arcuate convex structure which is then not under any thrust force, so that the substrate and the projected structure on the substrate are restored to their initial positions. Thus, the projected structure is actuated by the pushing piece.

For instance, according to some embodiments of the present invention, the pushing piece is pivoted within a plane parallel to the end surface of the cartridge body. The pivoting of the pushing piece may be in a horizontal plane.

For instance, according to some embodiments of the present invention, the arcuate convex structure and the substrate are formed in an integral structure.

For instance, according to some embodiments of the present invention, the arcuate convex structure may be a arcuate plate provided with four pins; and the substrate may further comprises fixing holes matched with the pins respectively.

BRIEF DESCRIPTION OF THE DRAWINGS

In order to describe the technical solution of the embodiment of present invention more clearly, a brief introduction will be made of the attached drawings of the embodiments. Obviously, the drawings described below relate to only some embodiments of present invention, rather than limiting the present invention.

DETAILED DESCRIPTION

A clear and complete description of the technical solutions of the embodiments of present invention will be made in conjunction with the drawings of the embodiments of present invention, and obviously, the described embodiments are only part of the embodiments for the present invention, rather than all the embodiments. Based on the embodiments of the present invention, all the other embodiments obtained by the ordinary skilled in this art without any creative endeavors fall into the protective scope of the present invention.

Unless defined otherwise, the technical terms or scientific terminology being used should take the meaning usually understood by the ordinary skilled in this art of present invention. The "first", "second" and similar words used in the description and claims of the present application does not denote any sequence, quantity or importance, but are used for distinguishing different components. Also, "one" or "a(an)" and the similar words do not mean quantitative restriction, but refer to the presence of at least one. Wording "including" or "comprising" and similar words means that element elements or articles before this word encompass the elements or articles and their equivalents listed after this word, rather than excluding other elements or articles. The "Coupling" or "coupled with" and the similar words are not limited to physical or mechanical connections, but may comprise electrical connection, no matter directly or indirectly. The words "upper", "lower", "left", "right" and the like are only used to denote a relative positional relationship, and when the described object is changed in its absolute position, this relative positional relationship may also be changed accordingly.

The embodiment of the present invention provides an IC cartridge for conveniently removing an IC chip from the IC cartridge in a processing procedure. The technical solution of the embodiment of the present invention provides an IC cartridge comprising a cartridge body formed with hollowed-out parts, and an ejection structure disposed beneath the cartridge body. Thus, the IC chip may be conveniently remove from the cartridge body. Accordingly, it is much easier to remove the IC chip from the cartridge, and meanwhile, the processing efficiency of the IC chip is improved. For better understanding of the purposes, technical solutions and advantages of the present invention, further detailed description is provided below with regard to the non-limiting examplary embodiments.

Figure 1:
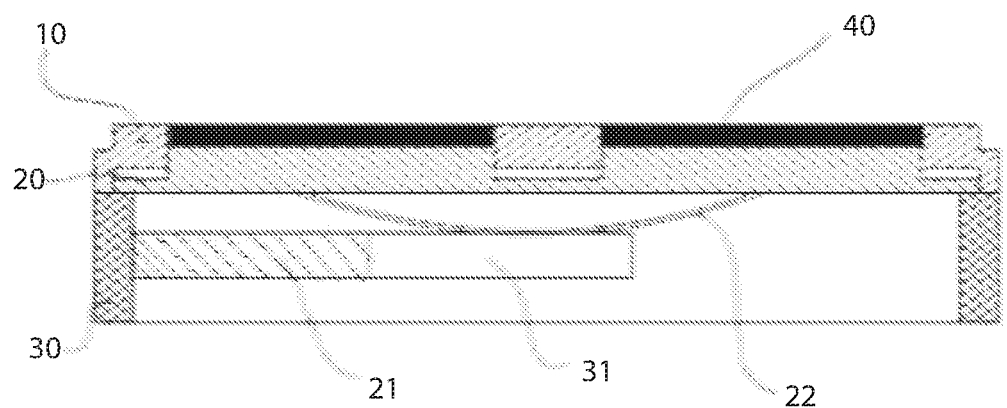
FIG. 1 is a sectional view of an IC cartridge according an embodiment of the present invention.

FIG. 1 is a sectional view of an IC cartridge provided by an embodiment of the present invention.

The embodiment of the present invention provides an IC cartridge, which comprises: a cartridge body 10 formed with hollowed-out parts 11; and an ejection mechanism 20 including a substrate 23 and projected structures 24 projecting from one surface of the substrate 23 for extending into the hollowed-out parts 11; wherein the hollowed-out parts 11 and the projected structures 24 together form groove structures for containing IC chips 40; and the projected structures 24 are slideably assembled with the cartridge body 10 and are configured to push the IC chips 40 disposed in the groove structures out from the hollowed-out part 11.

Figure 2:
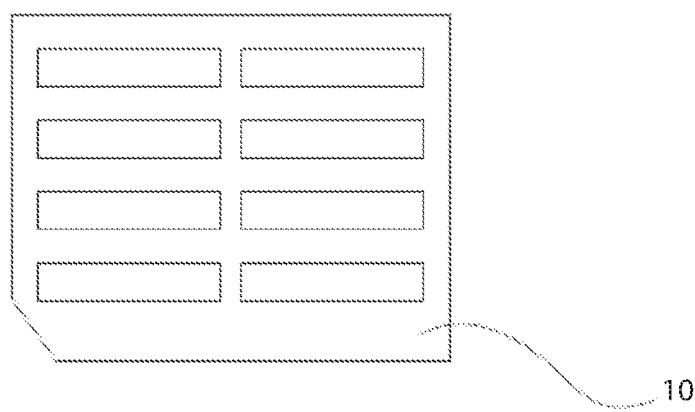
FIG. 2 is a top view of a cartridge body according to an embodiment of the present invention.
Figure 3:
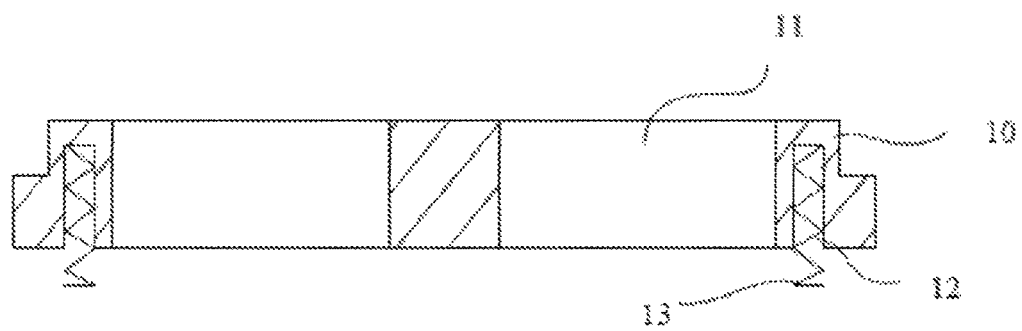
FIG. 3 is a sectional view of a cartridge body according to an embodiment of the present invention.
Figure 4:
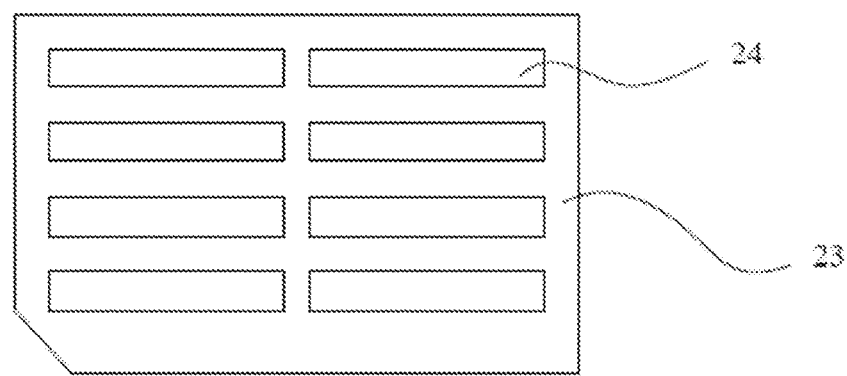
FIG. 4 is a top view of an ejection mechanism according to an the embodiment of the present invention.
Figure 5:
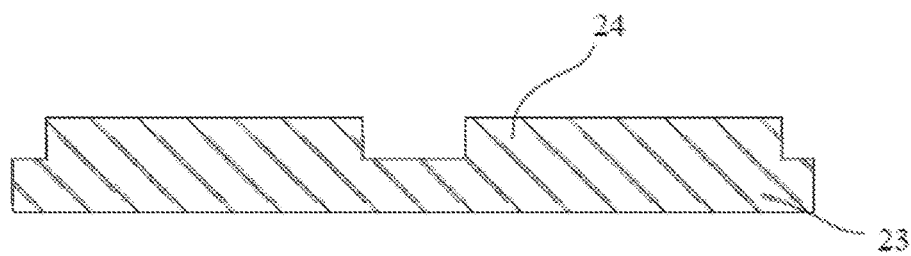
FIG. 5 is a sectional view of an ejection mechanism according to an embodiment of the present invention.
Figure 6:
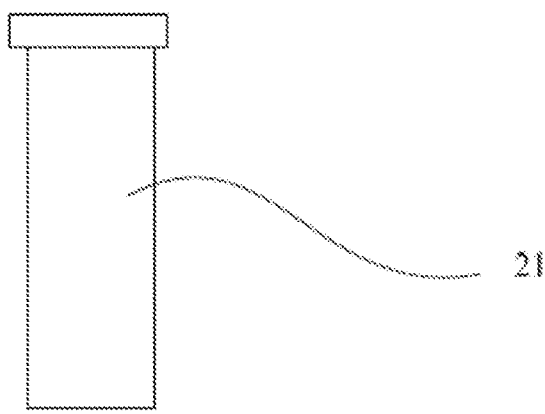
FIG. 6 is a structural schematic view of a pushing piece according to an the embodiment of the present invention.

With reference to FIGS. 2 to 5, FIG. 2 is a top view of a cartridge body 10 of an embodiment of the present invention; FIG. 3 is a sectional view of the cartridge body 10 of the embodiment of the present invention; FIG. 4 is a top view of an ejection mechanism 20 of the embodiment of the present invention; and FIG. 5 is a sectional view of the ejection mechanism 20 of the embodiment of the present invention. In the embodiment, the IC cartridge is provided with a cartridge body 10 with hollowed-out parts 11, and an ejection mechanism 20 disposed beneath the cartridge body 10. The ejection mechanism 20 comprises projected structures 24 which are arranged for properly engaging with the hollowed-out parts 11 respectively, such that the hollowed-out parts 11 and the projected structures 24 may be assembled together to form groove structures for containing IC chips 40. In the case of accommodating the IC chips 40, the IC chips 40 are placed into the groove structures. While the IC chips 40 needs to be removed from the cartridge, the projected structures 24 of the ejection mechanism 20 are moved through the hollowed-out parts 11, such that the IC chips 40 disposed in the groove structure 11 are pushed up by the projected structures 24, and then the IC chips 40 may be removed conveniently. When the IC chips 40 needs to be flipped over, the IC cartridge containing the IC chips 40 may be arranged to face against another empty IC cartridge. Subsequently, the IC chips 40 are pushed out from the cartridge body 10 holding the IC chips 40 by the ejection mechanism 20. At this point, the IC chips 40 is transferred from a cartridge body of one IC cartridge 10 into a cartridge body of another IC cartridge 10. After transfer of the IC chips is completed, the two IC cartridges are separated. Then, the flipover of the IC chips 40 is completed. As can be seen from the above description, the IC chips are conveniently removed by usage of the IC cartridge; the flipover of the IC chips 40 is also conveniently achieved; the processing efficiency of the IC chips 40 is improved; and meanwhile, the processing safety of the IC chips 40 is also ensured.

In another embodiment, as illustrated in FIGS. 2 and 3, a buffer unit is provided between the ejection mechanism 20 and the cartridge body 10. For instance, in one embodiment, the buffer unit is at least one buffer spring 13, two ends of which press against the cartridge body 10 and the substrate 23 respectively. As a result, the projected structures 24 may be restored to their initial positions by elastic force of the buffer spring 13 after the ejection process is completed. In addition, the usage of the buffer structure ensures that the projected structures 24 are hold at their initial position when there is no external force applied to the ejection mechanism 20. At this point, groove structures for accommodating the IC chips 40 are formed by the projected structures 24 and the hollowed-out parts 11. It should be noted that the embodiment only mentioned the structure of a pressure spring, and other structures such as torsional springs and tension springs may also be applied in the embodiment. The usage of the other springs is similar to the usage of the pressure spring, so further detailed description regarding those springs is omitted here.

Specifically, as illustrated in FIG. 3, in embodiment adopting the pressure spring, the cartridge body 10 is provided with a plurality of mounting holes 12 for mounting the buffer springs 13. Therefore, the pressure springs may be conveniently arranged. In addition, bending of the pressure spring when it is compressed can be avoided. Therefore, it is ensured that the pressure spring is capable to provide reliable restoring force.

In addition, the ejection mechanism 20 may also be provided with a supporting base 30 which is fixedly connected with the cartridge body 10, wherein a gap for accommodating the substrate 23 is formed between the supporting base 30 and the cartridge body 10, and an end surface of the supporting base 30 connected with the cartridge body 10 is pressed against the substrate 23. In one embodiment, for instance, as illustrated in FIG. 1, the supporting base 30 is formed in a hollow structure. The cartridge body 10 is formed with a recess portion for accommodating the substrate 23. The wall of the recess portion makes contact with a top surface of the supporting base 30. The thickness of the wall of the recess portion is smaller than that of a side wall of the supporting base 30, such that a part of the side wall of the supporting base 30 projects beyond the side wall of the recess portion and forms a structure for supporting the substrate 23. In other words, a space for accommodating the substrate 23 is formed by the side wall of the supporting base 30 and the recess portion of the cartridge body 10.

Wherein, the ejection mechanism 20 in the above embodiment may further include a drive mechanism. The drive mechanism may be various types of drive mechanism. Detailed description will be provided below as to the drive mechanism.

Figure 7:
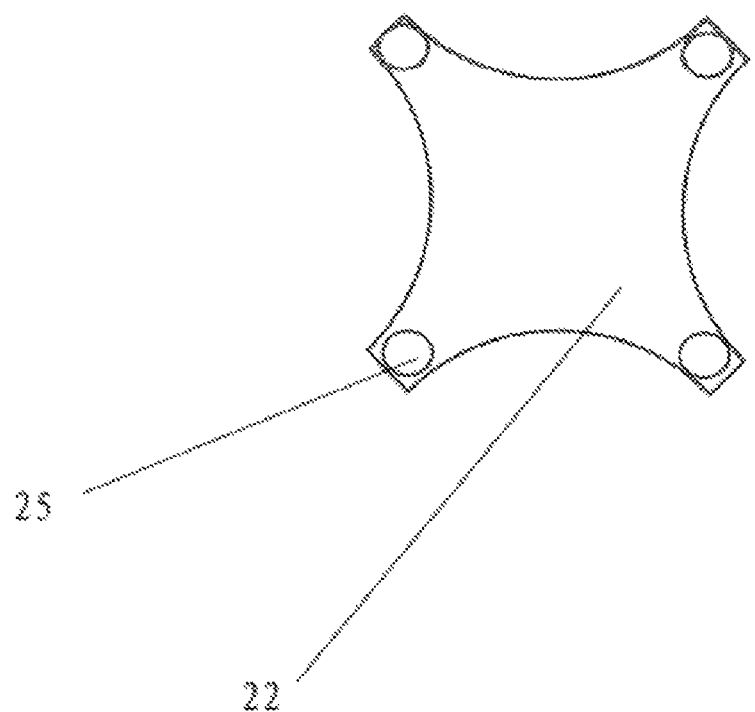
FIG. 7 is a structural schematic view of an arcuate convex structure with pins according to an embodiment of the present invention.
Figure 8:
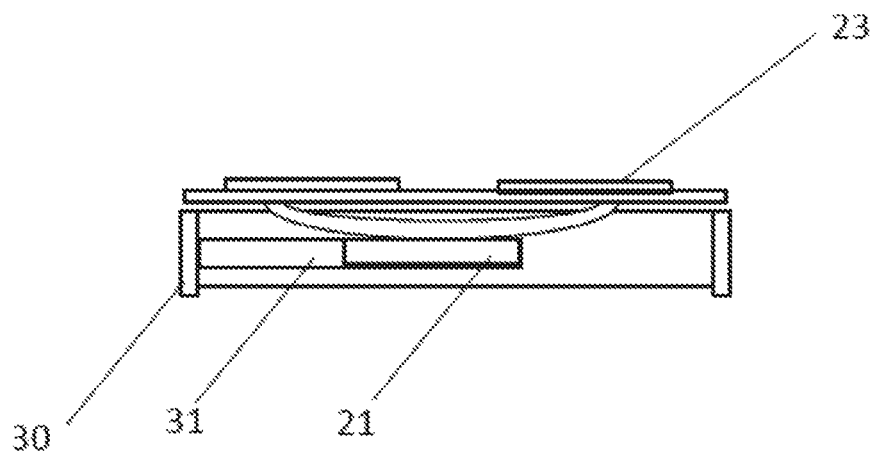
FIG. 8 is a structural schematic view of a pushing piece according to an embodiment of the present invention, showing the pushing piece being placed at a first position making contact with bottom of an arcuate convex structure to push up the arcuate convex structure and subsequently push up a substrate.
Figure 9:
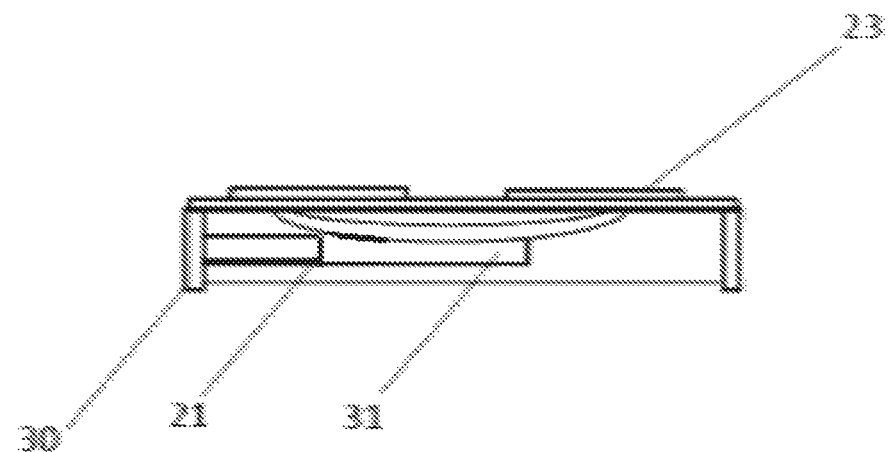
FIG. 9 is a structural schematic view of a pushing piece according to an embodiment of the present invention, showing the pushing piece being placed at a second position disengaged from bottom of an arcuate convex structure and a substrate remaining at its initial position.

With reference to FIG. 1 and FIGS. 6 to 9, the ejection mechanism 20 further includes a pushing piece 21 which is arranged at a side of the supporting base 30 and is slideably engaged in the supporting base 30. The substrate 23 is provided with an arcuate convex structure 22 for cooperating with the pushing piece 21. The pushing piece 21 reciprocates between a first position and a second position. As illustrated in FIG. 8, when the pushing piece 21 is placed at the first position, the pushing piece 21 presses against the bottom of the arcuate convex structure 22 and pushes the arcuate convex structure 22, which in turn pushes the substrate 23 up, such that the projected structures 24 on the substrate 23 raise and push the IC chips 40 out from the hollow-out structures 11. As illustrated in FIG. 9, when the pushing piece 21 is placed at the second position, the pushing piece 21 is disengaged from the bottom of the arcuate convex structure 22, thus no thrust force is applied to the arcuate convex structure 22, and hence the substrate 23 and the projected structures 24 of the substrate 23 are restored to their initial position. In the preferred embodiment, the arcuate convex structure 22 is moved by the pushing piece 21, that is to say, the arcuate convex structure 22 is pushed up by the pushing piece 21, and thus the substrate 23 is pushed up by the movement of the arcuate convex stucture 22. Accordingly, the projected structures 24 slide through the hollowed-out parts 11 respectively, and therefore the IC chips 40 contained in the groove structure are pushed up from the IC cartridge. In one embodiment, the pushing piece 21 is a straight flat structure and can be slideably accepted in the side wall of the supporting base 30. For instance, a sliding passage 31 is provided on the side surface of the supporting base 30, and the longitudinal direction of the sliding passage 31 is parallel to an end surface of the cartridge body 10. The pushing piece 21 is slideably accepted in the sliding passage 31 and is slidable in the sliding passage 31. Moreover, when the pushing piece 21 slides in the sliding passage 31, the pushing piece 21 may contact with or disengage from the bottom of the arcuate convex structure 22. Moreover, in the contact state, a force for pushing up the substrate 23 is applied to the arcuate convex structure 22, such that the IC chip 40 may be pushed up from the IC cartridge.

In another embodiment, for instance, the ejection structure 20 may be provided with a pushing piece 21 pivotably connected with the supporting base 30, and the substrate 23 is provided with an arcuate convex structure 22 for cooperating with the pushing piece 21. The pushing piece 21 pivots between a first position and a second position. When the pushing piece 21 is pivoted to the first position, the pushing piece 21 presses against the bottom of the arcuate convex structure 22 and pushes the arcuate convex structure 22, which in turn pushes up the substrate 23, such that the projected structures 24 on the substrate 23 raise and push up the IC chips 40 contained in the groove structure from the hollowed-out part 11. when the pushing piece 21 is pivoted to the second position, the pushing piece 21 is disengaged from the bottom of the arcuate convex structure 22 which is then not under any thrust force. Thus, the substrate 23 and the projected structures 24 on the substrate 23 are restored to their initial positions. Specifically, the pushing piece 21 in this embodiment functions the same as the pushing piece 21 in the previously described embodiment, and the difference is the connection means between the pushing piece 21 and the supporting base 30. In this embodiment, the connection means of the pushing piece 21 and the supporting base 30 is pivoting connection instead of slidable connection. As the pushing piece 21 is an elongated straight flate structure, large friction force tends to occur in the sliding process. In this embodiment, the connection means between the pushing piece 21 and the supporting base 30 is pivoting connection, such that during the pivoting process of the pushing piece 21, the pushing piece 21 may cooperates with the arcuate convex structure 22 to push the IC chips 40 from the cartridge body 10.

In addition, in the other embodiment, the connection between the arcuate convex structure 22 and the substrate 23 may be various connection means. For instance, the arcuate convex structure 22 and the substrate 23 may be separate structures. Wherein, as illustrated in FIG. 7, the arcuate convex structure 22 is a arcuate plate provided with four pins 25, and the substrate 23 is provided with fixing holes matching with the pins 25 respectively. Alternatively, the arcuate convex structure 22 and the substrate 23 may be an integrated structure. Both the above two structures may be applied to the embodiment. The specific connection means may be selected according to specific condition.

In addition, in one embodiment, for instance, the structure of the buffer spring 13 or the structure of the buffer spring 13 and the mounting holes 12 may be applied together with the ejection structure including the supporting base 30 or the ejection structure including the supporting base 30 and the pushing piece 21.

All the above are just specific embodiments of the present invention, but the scope of the present invention is not limited thereto, and various changes and alternation can be easily obtained by the skilled in this art within the disclosed technical scope by this invention, all of which should be encompassed in the protection reach of the present invention. Hence, the protection scope of the present invention should be accord with the protection scope of the claims.

What is claimed is:
1. An integrated chip (IC) cartridge, comprising:
a cartridge body provided with hollowed-out parts; and
an ejection mechanism, which includes:
  a substrate,
  projected structures which are provided on the substrate and capable of being extended into the hollowed-out parts,
  a supporting base fixedly connected with the cartridge body,
  a pushing piece, which is provided on a side wall of the supporting base, and is slideably engaged with the supporting base, and reciprocates between a first position and a second position;
wherein a gap is formed between the supporting base and the cartridge body for accommodating the substrate;
wherein the hollowed-out parts and the projected structures cooperatively form groove structures for containing IC chips; and
wherein the projected structures are slideable through the hollowed-out parts of the cartridge body and are configured to push the IC chips out from the hollowed-out parts;
wherein an arcuate convex structure is provided on the substrate for cooperating with the pushing piece;
wherein while the pushing piece is placed at the first position, the pushing piece presses against a bottom of the arcuate convex structure and pushes up the arcuate convex structure and hence pushes up the substrate, such that the projected structures on the substrate configured to raise and push the IC chips contained in the groove structures out from the hollowed-out parts; and
wherein while the pushing piece is disposed at the second position, the pushing piece is disengaged from the bottom of the arcuate convex structure which is then not under any thrust force, such that the substrate and the projected structures on the substrate are restored to their initial positions.

2. The IC cartridge according to claim 1, further comprising at least one buffer spring, wherein two ends of the buffer spring press against the cartridge body and the substrate respectively.

3. The IC cartridge according to claim 2, wherein the cartridge body is provided with at least one mounting hole for mounting the at least one buffer spring.

4. The IC cartridge according to claim 1, wherein the supporting base further comprises a sliding passage for slidably engaging with the pushing piece, and a longitudinal direction of the sliding passage is parallel to an end surface of the cartridge body.

5. The IC cartridge according to claim 1, wherein the arcuate convex structure and the substrate are formed in an integral structure.

6. The IC cartridge according to claim 5, wherein
the arcuate convex structure is a arcuate plate with four pins; and
the substrate further comprises fixing holes matching with the pins respectively.

7. An integrated chip (IC) cartridge, comprising:
a cartridge body provided with hollowed-out parts;
an ejection mechanism, which includes
  a substrate,
  projected structures which are provided on the substrate and capable of being extended into the hollowed-out parts,
  a supporting base fixedly connected with the cartridge body,
  a pushing piece, which is provided on a side wall of the supporting base, and is slideably engaged with the supporting base, and reciprocates between a first position and a second position;
wherein a gap is formed between the supporting base and the cartridge body for accommodating the substrate;
wherein the hollowed-out parts and the projected structures cooperatively form groove structures for containing IC chips; and
the projected structures are slideable through the hollowed-out parts of the cartridge body and are configured to push the IC chips out from the hollowed-out parts;
wherein
the ejection mechanism further comprises a pushing piece which is pivotally connected with the supporting base so as to pivot between a first position and a second position;
wherein the substrate is provided with an arcuate convex structure for cooperating with the pushing piece;
wherein while the pushing piece is pivoted to the first position, the pushing piece presses against a bottom of the arcuate convex structure and pushes up the arcuate convex structure and hence pushes up the substrate, so that the projected structures on the substrate configured to raise and push the IC chips contained in the groove structures out from the hollowed-out parts; and wherein while the pushing piece is pivoted to the second position, the pushing piece is disengaged from the bottom of the arcuate convex structure which is then not under any thrust force, so that the substrate and the projected structures on the substrate are restored to their initial positions.

8. The IC cartridge according to claim 7, wherein the pushing piece is pivoted within a plane parallel to an end surface of the cartridge body.

* * * * *